(12) United States Patent
Voiron et al.

(10) Patent No.: US 10,497,582 B2
(45) Date of Patent: Dec. 3, 2019

(54) CAPACITOR FORMED IN INSULATED PORES OF AN ANODIZED METAL LAYER

(71) Applicants: MURATA INTEGRATED PASSIVE SOLUTIONS, Caen (FR); COMMISSARIAT A L'ENERGIE ATOMIQUE ET AUX ENERGIES ALTERNATIVES, Paris (FR)

(72) Inventors: Frédéric Voiron, Barraux (FR); Guy Parat, Claix (FR)

(73) Assignees: MURATA INTEGRATED PASSIVE SOLUTIONS, Caen (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/033,348

(22) PCT Filed: Oct. 29, 2014

(86) PCT No.: PCT/FR2014/052754
§ 371 (c)(1),
(2) Date: Apr. 29, 2016

(87) PCT Pub. No.: WO2015/063420
PCT Pub. Date: May 7, 2015

(65) Prior Publication Data
US 2016/0268144 A1 Sep. 15, 2016

(30) Foreign Application Priority Data
Oct. 29, 2013 (FR) ...................................... 13 60555

(51) Int. Cl.
*H01L 27/08* (2006.01)
*H01G 4/005* (2006.01)
(Continued)

(52) U.S. Cl.
CPC .. *H01L 21/32133* (2013.01); *H01L 21/02258* (2013.01); *H01L 27/0805* (2013.01); *H01L 28/60* (2013.01); *H01G 4/005* (2013.01)

(58) Field of Classification Search
CPC ......... H01L 21/02258; H01L 21/32133; H01L 23/5223; H01L 27/0805; H01L 28/60; H01G 4/005
See application file for complete search history.

(56) References Cited

U.S. PATENT DOCUMENTS 6,057,571 A * 5/2000 Miller ................. H01L 23/5223
257/296
6,980,413 B1 12/2005 Kim et al.
(Continued)

FOREIGN PATENT DOCUMENTS

EP       1365444       11/2003
JP       2002299555 A       10/2002
(Continued)

OTHER PUBLICATIONS

P. Banerjee et al., "Nanotubular metal-insulator-metal capacitor arrays for energy storage," Nature Nanotechnology, vol. 4 (Jun. 2009), 9 pages.
(Continued)

*Primary Examiner* — Mohsen Ahmadi
*Assistant Examiner* — Christopher M Roland
(74) *Attorney, Agent, or Firm* — Arent Fox LLP

(57) ABSTRACT

A Metal-Insulator-Metal type capacitor structure (1) comprising a substrate (2), a first electrically insulating layer (14) placed on the substrate (2), a lower electrode (6) placed on the first insulating layer (14), a layer of structured metal (12) comprising a plurality of pores disposed on the lower electrode (6), a MIM capacitor (4) comprising a first conductive layer (18) placed on the structured metal layer (12)
(Continued)

in contact with the lower electrode (6) and inside the pores, a dielectric layer (20) covering the first conductive layer (18), a second conductive layer (24) covering the dielectric layer (20) in contact with an upper electrode (8) placed on the MIM capacitor (4) and a second electrically insulating layer (16) placed on the upper electrode (8).

18 Claims, 7 Drawing Sheets

(51) Int. Cl.
*H01L 21/3213* (2006.01)
*H01L 21/02* (2006.01)
*H01L 49/02* (2006.01)

(56) References Cited

U.S. PATENT DOCUMENTS

| | | | | |
|---|---|---|---|---|
| 2003/0213989 | A1* | 11/2003 | Delpech | H01L 23/5223 257/301 |
| 2005/0098205 | A1* | 5/2005 | Roscheisen | B82Y 10/00 136/263 |
| 2006/0014385 | A1 | 1/2006 | Kim et al. | |
| 2007/0232014 | A1* | 10/2007 | Larsen | H01L 28/40 438/393 |
| 2009/0034162 | A1* | 2/2009 | Yawata | H01G 9/0032 361/523 |
| 2010/0304204 | A1* | 12/2010 | Routkevitch | C01B 3/042 429/122 |
| 2011/0073827 | A1 | 3/2011 | Rubloff et al. | |
| 2014/0268491 | A1* | 9/2014 | Katkar | H01G 4/08 361/311 |

FOREIGN PATENT DOCUMENTS

| | | |
|---|---|---|
| JP | 2006041474 A | 2/2006 |
| JP | 2008153618 A | 7/2008 |

OTHER PUBLICATIONS

International search report for international application No. PCT/FR2014/052754, dated Mar. 4, 2015 (10 pages, including English translation.

* cited by examiner

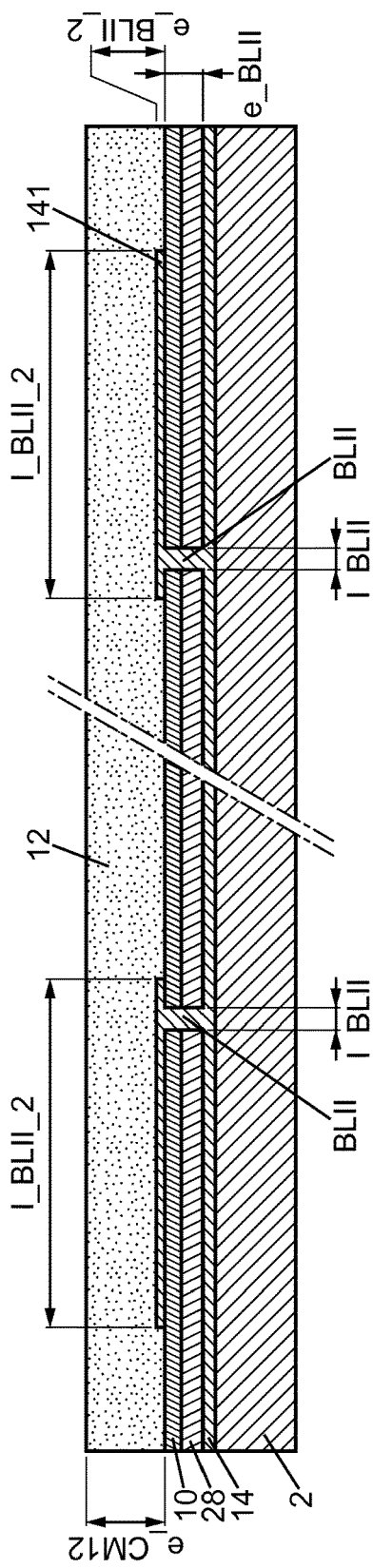
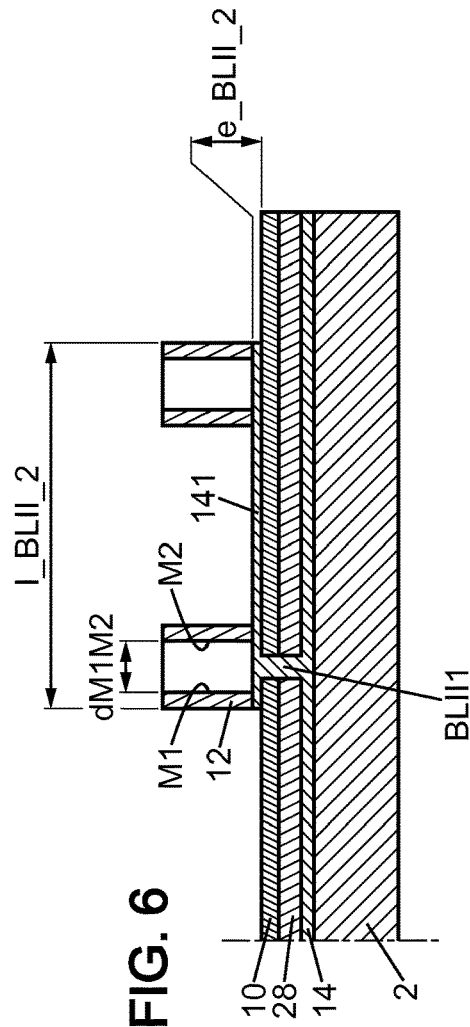
FIG. 5
FIG. 6

CAPACITOR FORMED IN INSULATED PORES OF AN ANODIZED METAL LAYER

CROSS-REFERENCE TO RELATED APPLICATIONS

This application is a National Stage entry of International Application No. PCT/FR2014/052754, filed on Oct. 29, 2014, which claims priority to French Application No. 1360555, filed on Oct. 29, 2013, the contents of each of these priority applications are hereby incorporated by reference in their entirety.

TECHNICAL FIELD

The present invention generally relates to Metal-Insulator-Metal capacitance. More specifically, the invention relates to a structure with a Metal-Insulator-Metal type capacitance from which a stack of Metal-Insulator-Metal type capacitors can be made.

The invention finds applications, in particular, in the field of microelectronics and more specifically in the field of passive and/or active components used for example in medical devices, in energy management devices or else in avionics.

BACKGROUND

Thanks to technological developments in microelectronics, it is now possible to integrate several complex functions on the same component to improve its performance. The integration of passive components and, more specifically, capacitors in integrated active or passive circuits is an important issue for developers. In fact, during the integration of such components, technological compatibility problems arise between the processes for manufacturing capacitors, for example, and passive or active components. In addition, storage requirement problems connected to the use of high-value capacitors arise.

Solutions have been explored, such as for example, the creation of Metal-Insulator-Metal (MIM) capacitors with anodizable layers enabling MIM deposition to be done inside holes obtained in said anodized layer.

Thus for example, a process enabling an MIM capacitor to be produced using an anodized layer is proposed in the NATURE TECHNOLOGY publication of May 2009, "Nanotubular metal-insulator-metal capacitor arrays for energy storage" by P. Banerjee et al. This publication presents a method of etching by anodizing an anodizable layer, enabling an MIM capacitor structure to be created. The MIM capacitors thus created enable capacitance values to be controlled in a relatively accurate way. However, such structures have relatively high internal resistance, which degrades the performance of such components and limits their integration in active circuits.

In addition, despite relatively high area ratios, thanks to the use of anodized layers, the densities of MIM capacitors thus obtained remain relatively low. Consequently, during the design of high-value capacitors, space requirement problems associated with this type of technology arise.

SUMMARY

The invention aims to overcome the aforementioned disadvantages from the prior art and, more specifically, aims to enable the production of a Metal-Insulator-Metal type capacitor structure with low access resistance.

Advantageously, a capacitor structure according to the invention will enable a structure with a limited footprint resulting in high integration capability to be obtained.

Preferably, a structure according to the invention will be easily attainable and/or will have a low cost. It may advantageously be integrated into a structure comprising active circuits.

For this purpose, the invention proposes a Metal-Insulator-Metal type capacitor structure comprising:
 a substrate,
 a first electrically insulating layer placed on the substrate,
 a lower electrode placed on the first electrically insulating layer,
 a layer of metal placed on the lower electrode and structured by a plurality of pores to form a pore insulating matrix,
 a Metal-Insulator-Metal type capacitor comprising a first conductive layer placed on the structured metal layer and inside the pores of said structured metal layer, a dielectric layer covering the first conductive layer, a second conductive layer covering the dielectric layer, each relevant pore comprising the first conductive layer and the second conductive layer separated by the dielectric layer.
 an upper electrode placed on the Metal-Insulator-metal type capacitor,
 a second electrically insulating layer placed on the upper electrode.

According to the invention, the first conductive layer situated inside the pores of the structured metal layer is in contact with the lower electrode and the second conductive layer situated inside the pores of the structured metal layer is in contact with the upper electrode.

The invention thus proposes an original capacitor structure of the Metal-Insulator-Metal type enabling, thanks to the presence of the lower electrode, the conductive layer situated inside the pores to be short-circuited and thus a capacitor structure of the Metal-Insulator-Metal type with low resistance to be obtained.

It is noted that in this structure, the pores of the structured metal layer are electrically insulated by a peripheral oxide layer from the rest of the structured metal layer in which they are produced. This oxide layer which forms a pore insulating matrix is created when the pores are produced in a layer of metal in order to form the structured metal layer. Thus, when the metal constituting the metal layer is aluminum, the oxide layer is a layer of alumina.

One advantageous embodiment of the invention proposes a Metal-insulator-Metal type capacitor structure comprising at least one lateral insulation strip placed in the lower electrode and dividing the lower electrode into two electrically distinct areas, at least one lateral insulation strip placed in the upper electrode that divides the upper electrode into two electrically distinct areas, and a further electrical contact from the lower electrode being arranged up to the level of the upper electrode by the structured metal layer.

Thanks to the combination of, first, pores of a porous structure opening onto a lower electrode and, second, the presence of lateral insulation strips, a structure enabling parallel-connected capacitors to be stacked is produced, which substantially allows the capacitance value for a given surface unit to be increased.

One advantageous embodiment of the invention provides that the lower electrode comprises a metal layer and an etch barrier layer. In this way, the etch barrier layer protects the metal layer when pores are made in the structured metal layer. The etch barrier layer may be, for example, deposited by Physical Vapor Deposition (PVD) or by Atomic Layer Deposition (ALD) and thus is very thin. Also, if its conductivity is low by its very nature (TiN, TaN), it will, however, be resistive to the flow of charges parallel to the etch barrier layer and/or over large distances. It is thus preferable to short-circuit this etch barrier layer to obtain good performance in terms of series resistance (ESR). This short-circuit is done by the metal layer integrated into the lower electrode. This structure corresponds to a particularly advantageous characteristic of the invention.

The lateral insulation strips are preferentially constituted of an insulating material selected, for example, from silicon oxide and silicon nitride in order to insulate the electrodes of the Metal-Insulator-Metal type capacitor two-by-two. This material is preferably deposited at low temperature, for example by a PECVD type process.

The invention proposes a preferred embodiment in which the metal-Insulator-Metal type capacitor is made in a structured metal layer comprised of a metal with a thickness of more than 0.4 µm, enabling cavities such as "deep" micropores or nanopores to be made and thus enabling the total equivalent surface (TES) of the capacitor to be increased.

In a Metal-Insulator-Metal type capacitor structure such as described here, the pore insulating matrix is a matrix obtained by anodic etching or by anodization.

In one example of embodiment, the structured metal layer is out of aluminum, and the pore insulating matrix is out of alumina.

In order to increase the density of the Metal-Insulator-Metal type capacitor, the dielectric layer placed between the two metal layers is advantageously comprised of an insulating material with a high-k dielectric constant, greater than 4 and preferentially greater than 10 (k>10).

Thanks to the use of a lower electrode as well as upper and lower lateral insulation strips, the Metal-Insulator-Metal type capacitor structure enables several Metal-Insulator-Metal type capacitors to be stacked one on top of the other. This stack enables the capacitance value of the structure, and thereby the capacitance value in relation to the constant equivalent surface, to be increased, thus enabling the integration of such a structure according to the invention to be improved. Two Metal-Insulator-Metal type capacitors of the stack are advantageously electrically coupled in parallel, which advantageously enables the capacitance values to be added to obtain high values with a constant footprint.

For the sake of simplification of the technological process, such a Metal-Insulator-Metal type capacitor structure according to the invention has a Metal-Insulator-Metal type capacitor of the stack electrically connected first by its upper electrode to the upper electrode of another Metal-Insulator-Metal type capacitor situated above it, and second by its lower electrode to the lower electrode of another Metal-Insulator-Metal type capacitor situated above it. This stack corresponds to a particularly advantageous characteristic of the invention.

According to a second aspect, the invention relates to a passive or active semiconductor product or device comprising at least one Metal-Insulator-Metal type capacitor as described above.

According to a third aspect of the invention, a process to manufacture such a structure is proposed, which comprises:
 a. preparing a substrate,
 b. deposition of a first electrically insulating layer of an insulating material on the substrate,
 c. producing a lower electrode placed on the first electrically insulating layer and comprising an etch barrier layer at its surface,
 d. depositing an electrically insulating material in the localized etching of the lower electrode,
 e. depositing a metal layer on the lower electrode,
 f. structuring pores in the metal layer preferentially by using an anodic etching process to form a pore insulating matrix,
 g. successively depositing a first conductive layer, a dielectric layer and a second conductive layer on the structured metal layer and in the pores of said structured layer,
 i. producing an upper electrode placed on the second conductive layer,
 j. depositing an electrically insulating material in the localized etching of the upper electrode,
 k. depositing a second electrically insulating layer of an insulating material on the upper electrode.

Such a process enables a Metal-Insulator-Metal type capacitor structure such as described above to be produced.

In one embodiment, the structured metal layer is out of aluminum, and the pore insulating matrix is out of alumina.

It may be expected that the lower electrode produced in step c) is made by depositing a layer of metal on the first electrically insulating layer, said metal layer then being covered by an etch barrier layer.

To then enable a stack of Metal-Insulator-Metal type capacitors, the production process according to the invention also advantageously proposes the steps of:
 c1) producing a lower lateral insulation strip by localized etching of the electrode defining two electrically insulated areas in the lower electrode after the production of said lower electrode, and
 h1) producing an upper lateral insulation strip by localized etching of the electrode defining two electrically insulated areas in the upper electrode after the production of said upper electrode.

An advantageous form of embodiment of the invention proposes a production process in which steps c), c1), d) to h) and h1) of the production process above are repeated N times.

In order to reduce topographical discontinuities, deposition of a planarization layer after at least one step h1) of the process, i.e., between two Metal-Insulator-Metal type capacitors of the stack, is provided.

BRIEF DESCRIPTION OF THE DRAWINGS

Other characteristics and advantages of the invention will appear upon reading the following description. The description is purely illustrative and should be read in conjunction with the appended drawings, in which:

FIGS. 2 to 8 represent the steps of a technological process according to the invention;

DETAILED DESCRIPTION OF THE EXEMPLARY EMBODIMENTS

Figure 1:
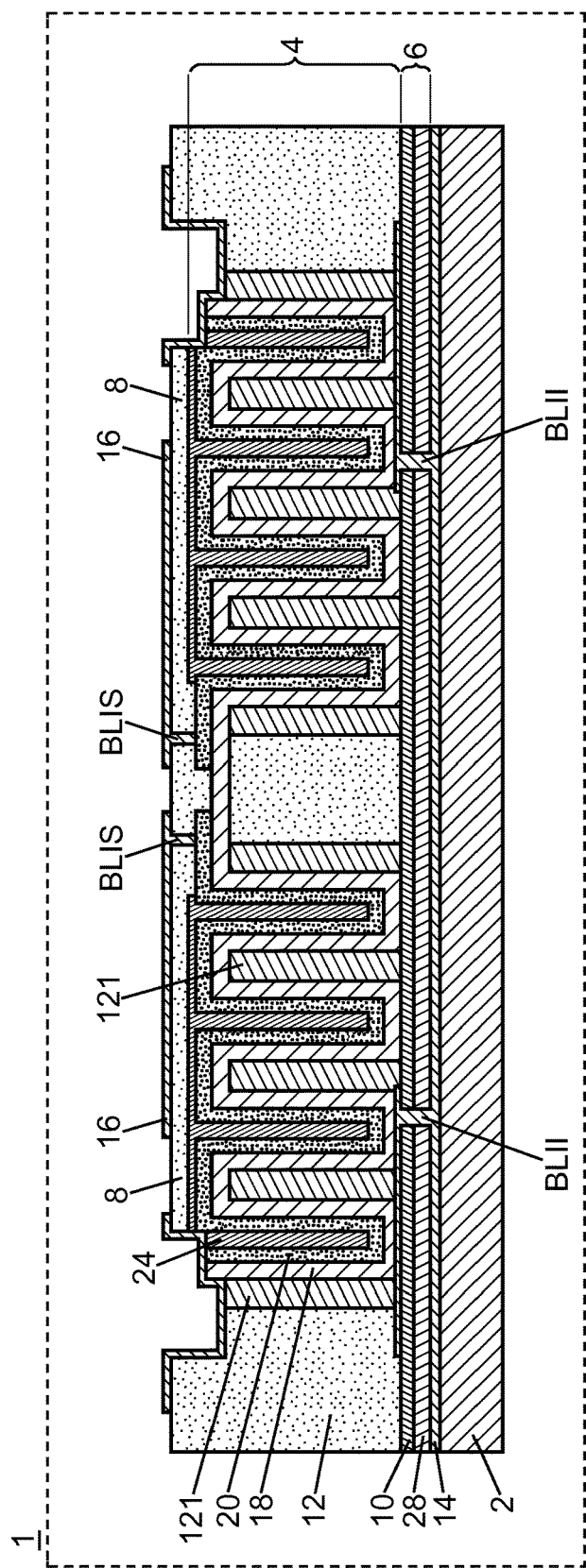
FIG. 1 is a cross-sectional view of an example of a MIM type capacitor structure according to an embodiment of the invention.

First, it should be noted that all figures illustrating the cross-sectional views of the capacitor structure as well as all figures illustrating the stacks of layers but also those representing the steps of the structure production process are not to scale. In addition, the different thicknesses are not realistically represented. For the sake of simplification, in the description and in the figures, elements that are common to all structures bear the same references.

The invention will be more specifically described in a non-limiting example of a Metal-Insulator-Metal type capacitor structure application that will subsequently be called in the rest of the description a MIM type capacitor structure. The MIM type capacitor structure example described below comprises a structured layer and more specifically a layer of nanostructured metal comprising a plurality of nanopores with a diameter d. The pores from the following description are nanopores but the invention can also be applied to a structure comprising pores with other dimensions, for example, micropores.

The metal layer may be in a metal such as for example aluminum (Al) with a thickness on the order of a micrometer (1 μm=10-6 m). The technological process enabling nanopores to be created in the metal layer will preferentially be a process using the anodic etching technique. The anodic etching process will be presented more precisely in the rest of the description.

The invention applies to a MIM type capacitor structure 1 comprising a lower electrode 6, a nanostructured layer 12, a MIM type capacitor 4 deposited on the nanostructured layer 12, said MIM type capacitor 4 comprising a first conductive layer 18 situated inside the pores of the nanostructured metal layer 12 and which is in contact with the lower electrode 6, a dielectric layer 20 and a second conductive layer 24 situated inside the pores of the nanostructured metal layer 12 and which is in contact with an upper electrode 8.

FIG. 1 shows a first example of a stack of layers constituting the MIM type capacitor structure 1. The figure comprises, in ascending order of the stack:
    a substrate 2,
    the first electrically insulating layer 14,
    the lower electrode 6 composed of a metal layer 28 and an etch barrier layer 10,
    the nanostructured metal layer 12,
    the MIM type capacitor 4 comprising the first conductive layer 18, the dielectric layer 20 and the second conductive layer 24,
    the upper electrode 8,
    a second electrically insulating layer 16.

The MIM type capacitor structure 1 represented in FIG. 1 also comprises a lower lateral insulation strip named BLII and an upper lateral insulation strip called BLIS. The upper and lower lateral insulation strips are sized to surround the MIM capacitor structure 1. As FIG. 1 is a cross-sectional view of said MIM type capacitor structure 1, two parts of the lower lateral insulation strip and two parts of the upper lateral insulation strip appear in the figure.

Lower lateral insulation strip BLII is placed between MIM type capacitor 4 and the first electrically insulating layer 14. It divides the lower electrode 6 into several electrically distinct areas in order to obtain electrical insulation between the first conductive layer 18 and the second conductive layer 24 of the MIM type capacitor 4.

The first electrically insulating layer 14 placed above substrate 2 and below lower electrode 6 enables the MIM type capacitor 4 of substrate 2 which may be, for example, a silicon wafer or an active circuit, to be electrically insulated. In fact, for the sake of optimizing and integrating the components on a silicon wafer, it is advantageous to electrically insulate the MIM type capacitor structure 1 in order to, first, not degrade its performance and, second, not influence, by its presence, the other components placed around it.

The upper lateral insulation strip BLIS (FIG. 1) divides the upper electrode 8 into several electrically distinct areas in order to obtain electrical insulation between the first conductive layer 18 and the second conductive layer 24 of the MIM type capacitor 4. The upper lateral insulation strip and the lower lateral insulation strip thus enable a MIM type capacitor structure 1 with a limited footprint and also with access electrodes that are electrically insulated from each other to be obtained, advantageously enabling several MIM type capacitor structures to be stacked on one another.

In another embodiment, not represented in the drawings, an original MIM type capacitor structure 1 is proposed, which enables without the presence of lower lateral insulation strips in the lower electrode 6 and without the presence of upper lateral insulation strips in the upper electrode 8, a MIM type capacitor structure 1 with low resistance to be obtained. The lower electrode 6 short-circuits the first conductive layer 18 at the bottom of each pore of the nanostructured metal layer 12, thus enabling a MIM type capacitor structure 1 with low resistance to be obtained.

The invention also proposes a process for producing the MIM type capacitor structure 1 of FIG. 1. This process comprises:
    preparation of the substrate 2,
    deposition of an insulating material to form the first electrically insulating layer 14,
    production of the lower electrode 6 placed on the first electrically insulating layer 14 by first depositing the metal layer 28 and then the etch barrier layer 10 above said metal layer,
    production of the lower lateral insulation strip by localized etching of the lower electrode 6 defining electrically insulated areas within it,
    deposition of an electrically insulating material in the localized etching of the lower electrode,
    deposition of a metal layer on the lower electrode 6,
    structuration of nanopores giving rise to an electrically insulating layer at the periphery of the pores named the pore insulating layer 121 in the layer of metal deposited on the lower electrode 6 preferentially using an anodic etching process to produce a layer of nanostructured metal 12,
    successive depositions of the first conductive layer 18, a dielectric layer 20 and the second conductive layer 24 on the nanostructured metal layer 12 and in the nanopores of said layer,
    production of an upper electrode 8 placed on the second conductive layer 24,
    production of the upper lateral insulation strip by localized etching of the upper electrode 8 defining electrically insulated areas within it,
    deposition of an electrically insulating material in the localized etching of the upper electrode 8 thus forming the upper lateral insulation strip,
    deposition of an insulating material on upper electrode 8 to form the second electrically insulating layer.

Here the structured metal layer is for example in aluminum, and the insulating matrix obtained by anodization is in alumina.

Several types of materials can be used to make substrate 2 as a support for the MIM type capacitor structure 1. Silicon (Si), which is predominantly used in the microelectronics industry particularly for its cost as well as for its semiconductive characteristics enabling active or passive components to be made, can be a substrate of choice for such a structure. However, it should be noted that other types of substrates can be used, such as for example, silicon carbide (SiC) substrates or silica substrates. It should be noted that the present invention is particularly adapted to a substrate on which active components have already been implanted.

Figure 2:
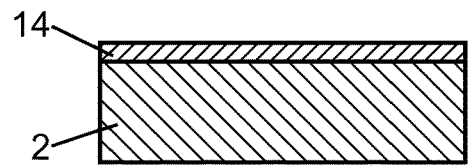

Due to its positioning, the first electrically insulating layer 14 (FIG. 2) enables the electrical couplings between the MIM type capacitor structure 1 and the substrate 2 to be controlled. The material used to make this first electrically insulating layer 14 must have a relatively low electric permittivity k in order to reduce the noise induced by the presence of the wafer, for example. Several types of insulating materials with dielectric permittivity (k on the order of 4 for example) can be used, such as for example silicon oxide or silicon nitride (Si3N4). In addition, the materials used must be compatible with the technological processes used to produce the MIM type capacitor structure 1 according to the invention.

Figure 3:
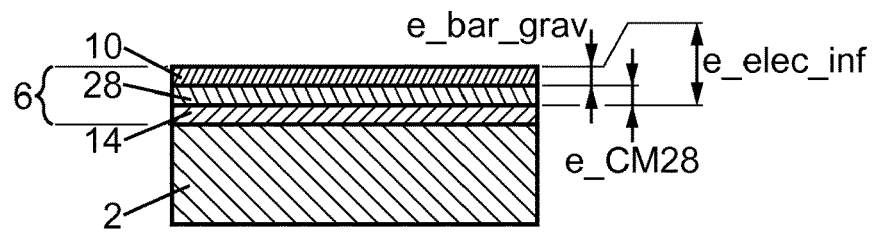
Figure 4:
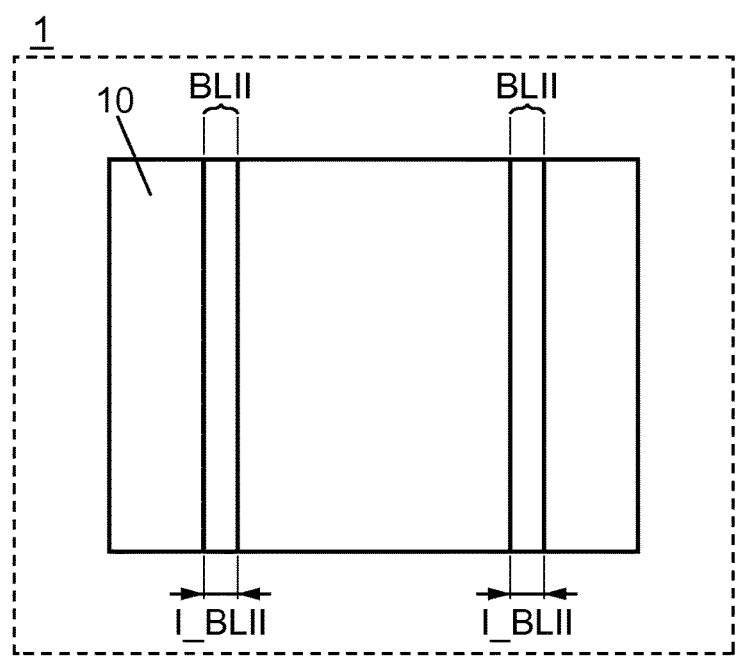

Lower electrode 6, characterized by a surface surf_e/e/_inf and a thickness e_lec_inf, is placed on the first electrically insulating layer 14 (Figure No, 3). It is composed of the metal layer 28 and the etch barrier layer 10 placed over the metal layer 28. The metal layer 28 may have a thickness e_CM28 for example of between 1 μm and 5 μm. In addition, lower electrode 6 may comprise other layers, not represented in FIG. 3. They may, for example, be inserted between the first electrically insulating layer 14 and the metal layer 28 to improve adhesion between these two layers. Lower electrode 6 may also only comprise a single layer such as for example the etch barrier layer 10.

The materials used to create the metal layer 28 may be for example aluminum (Al), copper (Cu), silver (Ag) combined or not combined with barrier metals such as for example titanium (Ti), titanium nitride (TiN), tantalum (Ta) or tantalum nitride (TaN). As this list is not exhaustive, other materials, alone or in combination with other materials, can be deposited according to a deposition process that is compatible with the process for producing the MIM type capacitor structure 1 and preferably having an equivalently low electrical resistivity.

The etch barrier layer 10 (FIG. 3) of the lower electrode 6 presents a thickness e_bar_grav and acts to stop the attack of the metal layer placed on the lower electrode 6 during anodic etching to give rise to the nanostructured metal layer 12, as will be subsequently presented in the rest of the description. The thickness e_bar_grav must be sufficient to tolerate the overetch necessary for the complete opening of nanopores on said etch barrier layer 10. The thickness e_bar_grav of the etch barrier layer 10 is on the order of 1 μm, for example. A process for producing nanopores will be described in further detail later.

To ensure electrical continuity between the first conductive layer 18 of the MIM type capacitor 4 and the lower electrode 6, said etch barrier layer 10 must have a sufficiently low electrical resistivity. To do this, said etch barrier layer 10 may be for example in a metal of the titanium (Ti), tantalum (Ta), titanium nitride (TiN) or tantalum nitride (TaN) type. Other anodization-resistant materials having the lowest possible electrical resistivity can be used. In addition, the type of material used to make this etch barrier layer 10 must be compatible with the anodic etching process. This compatibility results in a sufficient selectivity of the etching process used to open pores after anodization on said barrier layer 10.

The process of producing the MIM type capacitor structure 1 according to the invention enables a structure with a small footprint to be obtained. To do this, a lower lateral insulation strip BLII is made. To do this, a photolithography step enables continuous trenches to be made in the etch barrier layer 10 and metal layer 28. These trenches define the contour of the first conductive layer 18 and the second conductive layer 24, dividing the lower electrode 6 into three distinct areas. The width I_BLII of this trench (FIG. 5) is for example on the order of the cumulative thickness of the etch barrier layer 10 and the metal layer 28 corresponding to dimension e_BLII. An electrically insulating layer is then deposited over the etched structures. The thickness e_BLII_2 of this insulating layer may be thin such that only the sides of opening I_BLII are covered, or on the contrary, may be sufficiently thick so that a cover for the opening is made, this second case being represented in FIGS. 5 and 6. Lateral insulation strips are then made in a manner known to the person skilled in the art who knows how to obtain a cover with a width I_BLI1_2 after etching (FIG. 5).

The lower lateral insulation strips BLII are constituted of an electrically insulating material such as for example silicon nitride (Si3N4) deposited by using a PECVD type deposition method. Other materials as well as other deposition methods can be used. However, compatibility with the process for producing the MIM type capacitor based structure 1 is necessary.

A cover 141 situated on an upper part of the lower lateral insulation strip BLII is characterized by a width I_BLII_2 and a thickness e_BLII_2 and enables the first conductive layer 18 to be insulated from the second conductive layer 24 of the MIM type capacitor 4 (FIG. 6) over a row of nanopores. To ensure electrical insulation between said layers, the length of cover 141 is equal to the length of the lateral insulation strips BLII. In addition, the width I_BLII_2 of cover 141 is equal to or greater than the dimension I_BLII (FIG. 6) and is much greater than a distance dM1M2 corresponding to the diameter of a pore to ensure electrical insulation between the first conductive layer 18 and the second conductive layer 24.

FIG. 5 presents the metal layer, placed on the etch barrier layer 10 enabling nanopores to be created. This layer with a thickness e_CM12 is preferably greater than a micrometer and preferentially is between 4 μm and 8 μm. The type of material used must be compatible with an anodization process. Thus the metal used to make this layer may be aluminum (Al) for example. Anodization is an electrolytic process taking place in a humid environment. The principle is based on applying a difference in potential imposed between two conductive electrodes immersed in an electrolytic solution that may be, for example, acid. If the electrode is in aluminum, applying a potential to the anode increases the growth of alumina at its surface; consequently, its dissolution in the acid bath causes the appearance of nanopores or holes in the metal surface.

Advantageously, thanks to the anodization process, no photolithography step is used to create the pores. This process thus allows the method for producing such a structure to be optimized.

The nanopores advantageously have a diameter on the order of 50 nm and are spaced apart by 30 nm. In addition, the anodization process used in the present invention enables nanopores opening onto the etch barrier layer 10 of lower electrode 6 to be obtained. This characteristic is obtained by a short wet overetch of the anodized layer in a solution, for example dilute sulfuric acid. In other words, nanopores can be considered to be nanocylinders in which one side opens onto the etch barrier layer 10. Advantageously, using anodization to produce capacitor 4 enables a deployed surface ratio ETS on the order of 50 and preferentially 200.

Figure 7:
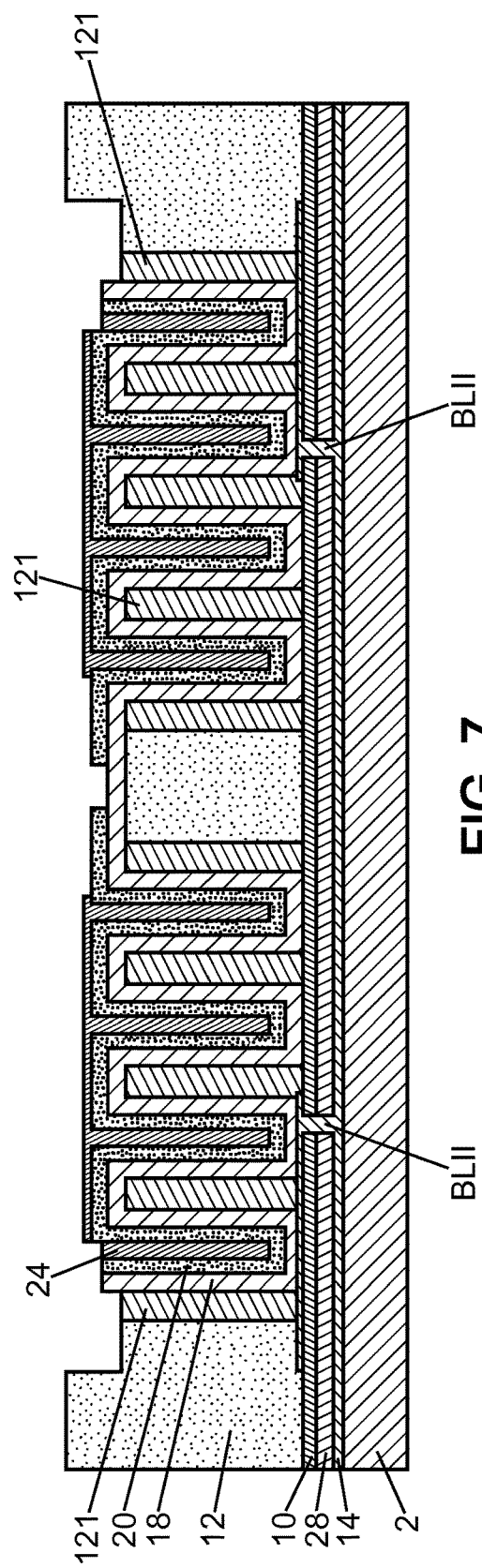

In order to produce the MIM type capacitor 4, the first conductive layer 18 is then deposited on the nanostructured metal layer 12 and inside the nanopores of said nanostructured metal layer 12 as presented in FIG. 7. The first conductive layer 18 situated at the bottom of the nanopores is in contact with the etch barrier layer 10 of lower electrode 6 enabling a low access resistance R_equ to be obtained. This first conductive layer 18 may be made by using an ALD type deposition technique, for example. The materials used can be, for example, TiN, TaN, NiB, Ru or any other conductive material using a deposition method enabling sufficient covering power to be obtained in accordance with the needs of the invention.

In fact, the MIM type capacitor structure 1 preferably presents an access resistance named R_equ, preferentially low. This access resistance R_equ is also controlled by the internal characteristics of lower electrode 6 and upper electrode 8, the dimensions and materials of which are preferably determined to obtain a low access resistance R_equ. This first MIM capacitor 4 electrode 6 is shaped for example by a photolithography process known from the prior art.

Dielectric layer 20 enables the capacitance between the first conductive layer 18 and the second conductive layer 24 forming conductive electrodes to be created. The material used to make this dielectric layer 20 must have the highest possible electric permittivity k in order to maximize the value of the capacitance produced. Several types of materials known as "High-k" materials, preferentially with an electric permittivity of (k>6) can be used, such as for example, silicon nitride (Si3N4), alumina (aluminum oxide), hafnium oxide (HfO2), or any other material with an electric permittivity equal to or greater than the materials cited previously. In addition, the materials used must be compatible with the technological processes used to product the MIM type capacitor structure 1 according to the invention.

The person skilled in the art knows that there are two parameters controlling the insulating effect of a layer. These two parameters are the electric permittivity k mentioned previously and the thickness of said layer. The thickness of the first dielectric layer is for example between 5 nm and 80 nm (1 nm=$10^{-9}$ m), preferentially it may be a thickness on the order of 30 nm.

The deposition methods enabling dielectric layer 20 to be obtained can use various techniques known to the person skilled in the art. By way of example, Atomic Layer Deposition (or ALD), or Low Pressure Chemical Vapor Deposition (or LPCVD) can preferentially be used.

The second conductive layer 24 as presented in FIG. 7 is then deposited on dielectric layer 20, thus enabling a MIM type capacitor 4 to be created. The characteristics of this second conductive layer 24 as well as the deposition methods may be identical to those used to make the first conductive layer 18.

The layers constituting the MIM structure comprising the first conductive layer 18 and the second conductive layer 24 as well as the dielectric layer 20 are shaped, as illustrated in FIG. 7, for example by a photolithography process known from the prior art.

Figure 8:
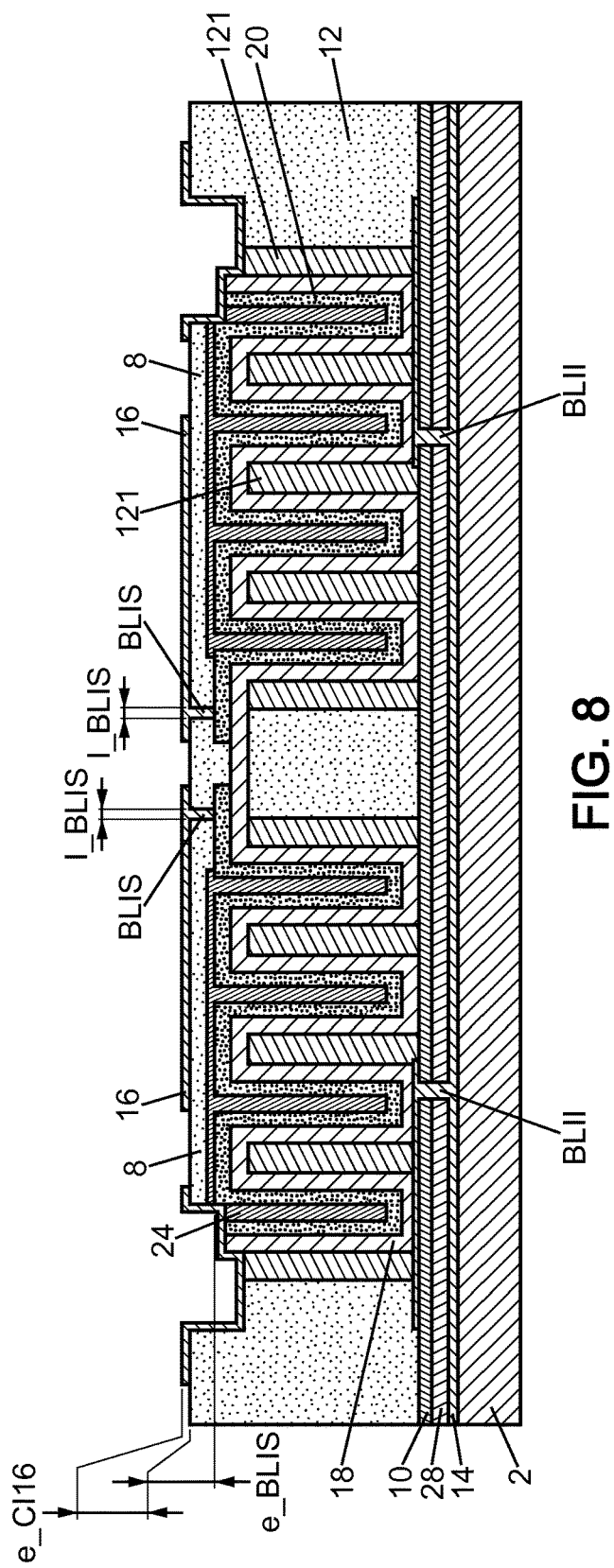

A layer of metal is then deposited to constitute the upper electrode 8 as presented in FIG. 8. Upper electrode 8 is characterized by a thickness whose value is for example on the order of 1 µm to 5 µm. The value of the upper electrode 8 thickness is controlled (as explained previously in the description) to obtain an equivalent resistance value R_equ of the desired MIM type capacitor structure 1. The materials used to create the upper electrode 8 may be for example aluminum (Al), copper (Cu), silver (Ag) combined or not combined with barrier metals such as for example titanium nitride (TiN) or tantalum nitride (TaN). As this list is not exhaustive, other materials, alone or in combination with other materials, can be deposited according to a deposition process that is compatible with the process for producing the MIM type capacitor structure 1 and preferably having a low electrical resistivity, can be used. Upper electrode 8 may also be made in several layers (not represented in the figures).

The upper lateral insulation strip BLIS is characterized by a thickness e BLIS and a width I_BLIS as presented in FIG. 8. Upper lateral insulation strip BLIS is constituted of an electrically insulating material such as for example silicon nitride (Si3N4) deposited for example by using a PECVD type deposition method. Other materials as well as other deposition methods can be used. However, compatibility with the process for producing the MIM type capacitor based structure 1 is necessary.

The dimensional characteristics of the upper lateral insulation strip BLIS (FIG. 8) are equivalent to those of the lower lateral insulation strip BLII. In addition, width I_BLIS of the upper lateral insulation strip BLIS is much wider than the diameter d of a nanopore in order to prevent a short-circuit between the first conductive layer 18 and the second conductive layer 24 of the MIM type capacitor 4.

The method of producing the upper lateral insulation strip BLIS is preferably identical to that of the lower lateral insulation strip BLII.

The second electrically insulating layer 16 is then deposited on the upper electrode 8. The material preferentially has a low electric permittivity k in order to eliminate any short-circuit or electrical interference noise induced. Several types of materials can be used, such as for example, silicon nitride (Si3N4), silicon oxide (SiO2) or any other material with an electric permittivity less than or equal to the materials cited previously and which are compatible with the technological processes described in the previous paragraphs.

The second electrically insulating layer 16 as presented in FIG. 8 is characterized by a thickness named e_CI16, the value of which is on the order of for example 100 nm. Deposition methods enabling such a second electrically insulating layer 16 to be obtained which are known to the person skilled in the art and have already been described previously when lower electrode 6 was made will not be summarized again here.

Figure 9:
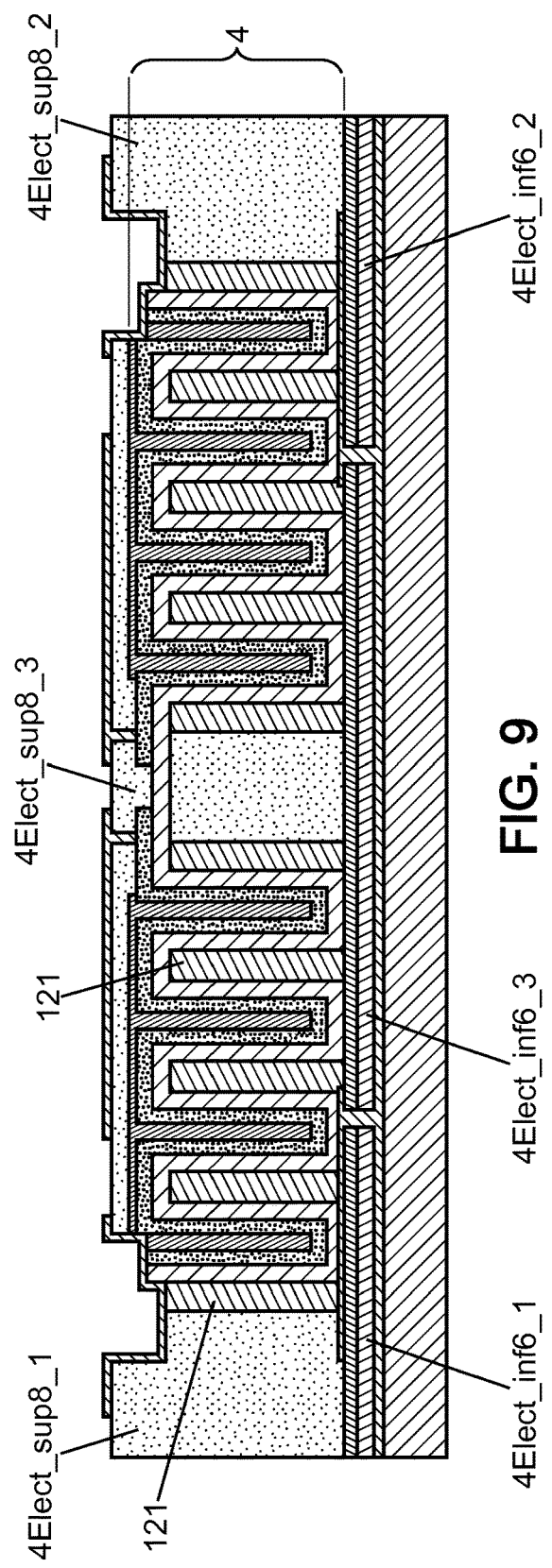
FIG. 9 is a schematic cross-sectional view of an example of a MIM type capacitor structure according to the invention.

The lower lateral insulation strip BLII and the upper lateral insulation strip BLIS respectively divide the lower electrode and the upper electrode and thus enable distinct electrically insulated areas to be created. For the sake of clarity of the description, the distinct areas of each electrode are subsequently named, for lower electrode 6 respectively, 4Elect_inf6_1, 4Elect_inf6_2, 4Elect_inf6_3 and for upper electrode 8 respectively 4Elect_sup8_1, 4Elect_sup8_2, 4Elect_sup8_3. FIG. 9 presents a view of these different areas.

The presence of the nanostructured metal layer 12 enables coupling on the one hand between area 4Elect_inf6_1 of lower electrode 6 and area 4Elect_sup8_1 of upper electrode 8, which will be named left lateral electrode in the rest of the description, and on the other hand between the area named 4Elect_inf6_2 of lower electrode 6 and the area 4Elect_sup8_2 of upper electrode 8 that will also be named right lateral electrode in the rest of the description. In addition, the nanostructured metal layer 12 enables coupling between area 4Elect_inf6_3 of lower electrode 6 and area 4Elect_sup8_3 of upper electrode 8 and will be named central electrode. Thus, connections of the MIM type capacitor 4 are formed on both sides of the MIM type capacitor structure 1. In one embodiment, the left lateral electrode and the right lateral electrode are coupled to one another.

Figure 10:
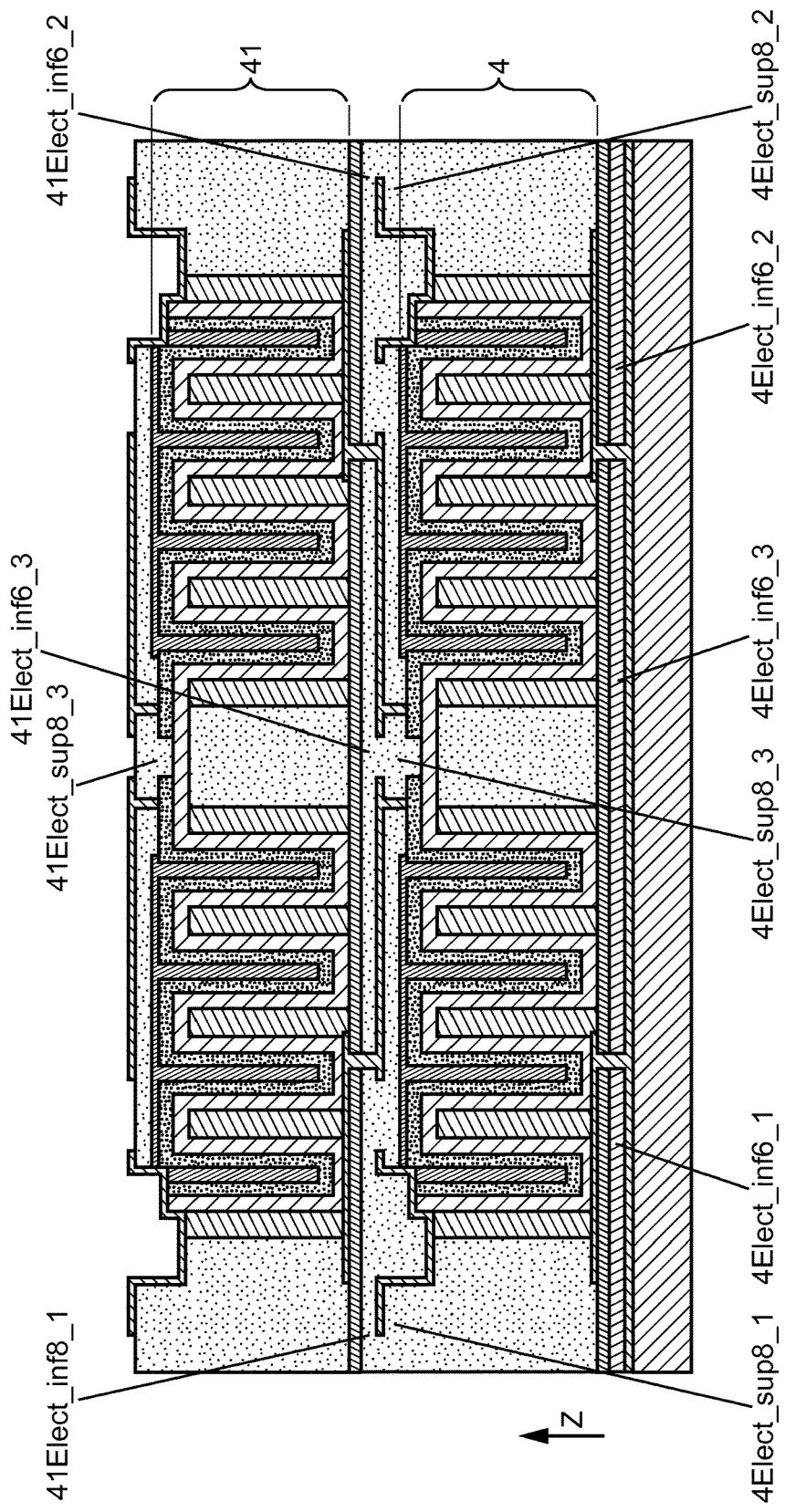
FIG. 10 is a schematic cross-sectional view of a stack of two MIM type capacitors in a MIM type capacitor structure according to the invention.

In order to obtain a MIM type capacitor structure 1 with a high vertical integratability in Z (FIG. 10), an embodiment of the invention provides for duplicating N stages in a MIM type capacitor structure. In order to simplify the description, an example of a MIM type capacitor structure composed of two (N=2) stages named E_1 and E_2 is represented in the graph of FIG. 10. It should be noted that the method of producing N stages is identical to the method of producing the MIM type capacitor structure 1 and consequently it will not be described in detail in the rest of the description.

The process enabling a MIM type capacitor structure according to the invention to be made comprises:
  preparation of the substrate 2,
    deposition of a first electrically insulating layer 14 in an insulating material,
    the production of the first stage E_1 with the MIM type capacitor 4,
    the production of the second stage E_2 with the MIM type capacitor 41.

The areas of each electrode of each stack are now named (FIG. 10) for stack E_1 comprising the MIM type capacitor 4 4Elect_inf6_1, 4Elect_inf6_2, 4Elect_inf6_3 and 4Elect_sup8_1, 4Elect_sup8_2, 4Elect_sup8_3. As for stack E_2 comprising MIM type capacitor 41, they are named 41Elect_ inf6_1, 41Elect_inf6_2, 41Elect_inf6_3 and 41Elect_sup8_1, 41Elect_sup8_2, 41Elect_sup8_2.

Advantageously, thanks to the presence of the lateral insulation strips of each capacitor of the stack, a left lateral electrode constituted of area 41Elect_sup8_1 of capacitor 41 is connected to area 41Elect_inf6_1, itself connected to area 4Elect_sup8_1 of MIM type capacitor 4 which is itself connected to area 4Elect_inf6_1. In addition, another right lateral electrode constituted of area 41Elect_sup8_2 of capacitor 41 is connected to area 41Elect_inf6_2, itself connected to area 4Elect_sup8_2 of MIM type capacitor 4 which is itself connected to area 4Elect_inf6_2. A central electrode is constituted of area 41Elect_sup8_3 of capacitor 41 and is connected to area 41Elect_inf6_3, itself connected to area 4Elect_sup8_3 of MIM type capacitor 4 which is itself connected to area 4Elect_inf6_3.

In an embodiment, the left lateral electrode and the right lateral electrode are coupled to one another. This coupling between the different areas of each capacitor 4, 41 thus enables parallel type coupling to be obtained between said capacitors 4, 41. This parallel type coupling between capacitors 4, 41 of the stack enables the values of each capacitor 4, 41 of the MIM type capacitor structure to be added and thus enables a highly integrated MIM type capacitor structure to be obtained.

In addition, for a MIM type capacitor structure comprising N stacks, the value of the total capacitance of the MIM type capacitor structure will be equal to the sum of the values of each capacitor 4, 41, . . . , 4N of the stack.

In addition, this stack enables the series resistance of the component to be divided because the overall resistance corresponds to the individual resistance of each element, divided by the number of parallelized elements.

During the design of such a structure, problems with planarity may appear between the different layers constituting said MIM type capacitor structure. In fact, the presence of many superimposed layers may give rise to topographical discontinuities in the MIM type capacitor structure.

In order to reduce this topographical discontinuity, adding a planarization layer (not represented in the figures) between each stack is possible, which enables any topographical discontinuities due to the presence of a plurality of layers on substrate 2 to be reduced. This planarization layer may be deposited once the number of stages is greater than 1.

The present invention thus enables a MIM type capacitor structure 1 with a low access resistance R_equ to be produced thanks to the contact of the first conductive layer 18 on the etch barrier layer 10, as well as the paralleling of resistances of different stages, with a small footprint. In addition, the present invention enables, thanks to the use of upper and lower lateral insulation strips, a MIM type capacitor structure with limited dimensions in Z and a high capacitance value per surface unit to be obtained.

In addition, the production process proposed here is compatible with most of the processes for producing active components, which enables integration of a structure according to the present invention into complex circuits integrating passive and active components and particularly into interconnect levels. In this way, the capacitance/storage requirement ratio is optimized and the costs of integrating high value capacitor elements may be substantially reduced.

The description above was given for illustrative purposes only and is not limiting of the scope of the invention. Any technical feasible variation of embodiment may be preferred to the embodiments described. In addition, the steps of the technological process described in the invention are given for illustrative purposes and are not limited to the examples given here. Lastly, it is understood that the various innovations described can be used separately or in combination, depending on the desired qualities and performance for a MIM type capacitor structure according to the invention.

The invention claimed is:
1. A Metal-Insulator-Metal type capacitor structure comprising:
  a substrate;
  a first electrically insulating layer disposed on the substrate;
  a lower electrode disposed on the first electrically insulating layer;
  a layer of metal disposed on the lower electrode and comprising a plurality of pores that are electrically insulated by an electrically-insulating peripheral oxide layer from a structured metal layer in which the plurality of pores are produced, said electrically-insulating peripheral oxide layer forming a pore insulating matrix obtained by anodic etching;
  a capacitor of Metal-Insulator-Metal type comprising a first conductive layer disposed on the structured metal layer and inside the pores of said structured metal layer, a dielectric layer covering the first conductive layer, a second conductive layer covering the dielectric layer, wherein each pore comprises the first conductive layer and the second conductive layer separated by the dielectric layer;
  an upper electrode disposed on the Metal-Insulator-Metal type capacitor;
  a second electrically insulating layer disposed on the upper electrode;
wherein:
  the first conductive layer disposed inside the pores of the structured metal layer is in contact with the lower electrode, the second conductive layer disposed inside the pores of the structured metal layer is in contact with the upper electrode, and the lower electrode comprises a metal layer and an etch barrier layer that is resistant to anodic etching and is disposed between the metal layer of the lower electrode and the pore insulating matrix.

2. The Metal-Insulator-Metal type capacitor structure according to claim 1 further comprising:
   at least one lateral insulation strip disposed in the lower electrode and dividing the lower electrode into two electrically distinct areas;
   at least one lateral insulation strip in the upper electrode and dividing the upper electrode into two electrically distinct areas; and
   a further electrical contact from the lower electrode extends to the upper electrode by the structured metal layer.

3. The Metal-Insulator-Metal type capacitor structure according to claim 2, wherein the at least one lateral insulation strip comprises an insulating material selected from the group containing silicon oxide and silicon nitride.

4. The Metal-Insulator-Metal type capacitor structure according to claim 1, wherein the structured metal layer is microstructured or nanostructured and is comprised of a metal with a thickness of more than 0.4 μm.

5. The Metal-Insulator-Metal type capacitor structure according to claim 1, wherein the structured metal layer comprises aluminum and the pore insulating matrix comprises alumina.

6. The Metal-Insulator-Metal type capacitor structure according to claim 1, wherein the dielectric layer comprises an insulating material having a high dielectric constant k, greater than 4 (k>4) and preferentially greater than 10.

7. The Metal-Insulator-Metal type capacitor structure according to claim 1, further comprising a plurality of Metal-Insulator-Metal type capacitors stacked on each other.

8. The Metal-Insulator-Metal type capacitor structure according to claim 7, wherein at least two of the plurality of Metal-Insulator-Metal type capacitors of the stack are electrically coupled in parallel.

9. The Metal-Insulator-Metal type capacitor structure according to claim 7, wherein the upper electrode of one of the plurality of Metal-Insulator-Metal type capacitors of the stack is electrically connected to the upper electrode of another Metal-Insulator-Metal type capacitor and the lower electrode of the one Metal-Insulator-Metal type capacitor is electrically connected to the lower electrode of another Metal-Insulator-Metal type capacitor situated above the one Metal-Insulator-Metal type capacitor.

10. A passive or active electronic semiconductor device comprising at least one Metal-Insulator-Metal type capacitor structure according to claim 1.

11. The Metal-Insulator-Metal type capacitor structure according to claim 1, wherein the etch barrier layer has an electrical resistivity, such that there is electrical continuity between the first conductive layer and the lower electrode.

12. The Metal-Insulator-Metal type capacitor structure according to claim 1, further comprising:
    at least one additional capacitor of Metal-Insulator-Metal type stacked on the capacitor of Metal-Insulator-Metal type, the at least one additional capacitor including:
       an additional first conductive layer disposed on an additional structured metal layer and inside pores of said additional structured metal layer,
       an additional dielectric layer covering the additional first conductive layer,
       an additional second conductive layer covering the additional dielectric layer,
       wherein each pore comprises the additional first conductive layer and the additional second conductive layer separated by the additional dielectric layer,
       wherein the additional first conductive layer disposed inside the pores of the additional structured metal layer is in contact with the upper electrode to form at least two stages for the Metal-Insulator-Metal type capacitor structure.

13. A method for producing a Metal-Insulator-Metal type capacitor structure, the method comprising:
    a. preparing a substrate;
    b. depositing a first electrically insulating layer of an insulating material on the substrate;
    c. producing a lower electrode on the first electrically insulating layer, the lower electrode being produced by depositing a layer of metal on the first electrically insulating layer and covering said deposited metal layer by an etch barrier layer that is resistant to anodic etching;
    d. performing localized etching of the lower electrode and depositing an electrically insulating material in the localized etching of the lower electrode;
    e. depositing a metal layer on the lower electrode;
    f. structuring pores in the metal layer by using an anodic etching process, said pores being electrically insulated by an electrically-insulating peripheral oxide layer from a structured metal layer in which the plurality of pores are produced, said electrically-insulating peripheral oxide layer forming a pore insulating matrix;
    g. successively depositing a first conductive layer, a dielectric layer and a second conductive layer on the structured metal layer and in the pores of said structured layer;
    h. producing an upper electrode placed on the second conductive layer;
    i. performing localized etching of the upper electrode and depositing an electrically insulating material in the localized etching of the upper electrode; and
    j. depositing a second electrically insulating layer of an insulating material on the upper electrode.

14. The method according to claim 13, wherein the structured metal layer is formed of aluminum and the pore insulating matrix formed by anodic etching is formed of alumina.

15. The method for producing a Metal-Insulator-Metal type capacitor structure according to claim 13, wherein:
    step d) comprises producing a lower lateral insulation strip by said localized etching of the lower electrode, defining two electrically insulated areas in the lower electrode, after the production of said lower electrode, and
    step i) comprises producing an upper lateral insulation strip by said localized etching of the upper electrode, defining two electrically insulated areas in the upper electrode, after the production of said upper electrode.

16. The method for producing a Metal-Insulator-Metal type capacitor structure according to claim 15, wherein steps c) through j) are repeated N times.

17. The method for producing a Metal-Insulator-Metal type capacitor structure according to claim 16, further comprising depositing a planarization layer after at least one step i).

18. The process for producing a Metal-Insulator-Metal type capacitor structure according to claim 13, wherein step c) comprises depositing as said etch barrier layer a layer having an electrical resistivity, such that there is electrical continuity between the first conductive layer and the lower electrode.

\* \* \* \* \*